(12) United States Patent
    Nikitin

(10) Patent No.: US 7,989,152 B2
(45) Date of Patent: Aug. 2, 2011

(54) MAGNETO-OPTICAL PHOTORESIST

(75) Inventor: Vladimir Nikitin, Campbell, CA (US)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 973 days.

(21) Appl. No.: 11/644,927

(22) Filed: Dec. 21, 2006

(65) Prior Publication Data

US 2008/0151207 A1   Jun. 26, 2008

(51) Int. Cl.
    *G11B 5/127*   (2006.01)
(52) U.S. Cl. ............... 430/322; 430/320; 29/603.13; 216/22; 216/42
(58) Field of Classification Search .......... None
    See application file for complete search history.

(56) References Cited

FOREIGN PATENT DOCUMENTS
WO    WO 2005/065303    *   7/2005

OTHER PUBLICATIONS

Sensors and Actuators A, 128, Jan. 7, 2006, pp. 43-51, "A Study on the Development of a Continuous Peristaltic Micropump using Magnetic fluids", Eui-Gyu Kim et al.*

* cited by examiner

*Primary Examiner* — Daborah Chacko-Davis

(57) ABSTRACT

A method for a magneto-optical photoresist. The method includes applying a magneto-optical photoresist to a surface, and patterning the magneto-optical photoresist by using a magnetic alignment. The magneto-optical photoresist is also patterned by using a photo exposure, wherein the magnetic alignment provides a photo exposure alignment for the photo exposure.

9 Claims, 8 Drawing Sheets

MAGNETO-OPTICAL PHOTORESIST

FIELD OF THE INVENTION

The present invention is generally related to photoresist processes and techniques.

BACKGROUND OF THE INVENTION

Most of the power and usefulness of today's digital IC devices can be attributed to the increasing levels of integration. More and more components (resistors, diodes, transistors, and the like) are continually being integrated into the underlying chip, or substrate. The substrate is then cut into a number of its constituent integrated circuit devices, analog devices, or other types of thin-film devices such as, for example, thin-film magnetic recording heads and head subcomponents.

The starting material may typically be very high purity silicon. Another exemplary substrate may be made of Alumina Titanium Carbide (AlTiC). The material is grown as a single crystal, taking the shape of a solid cylinder. This crystal is then sawed (like a loaf of bread) to produce wafers typically 10 to 30 cm in diameter and 250 microns thick.

The geometry of the features of the components are generally defined photographically through a process known as photolithography. Very fine surface geometries can be reproduced accurately by this technique. The photolithography process is used to define component regions and build up components one layer on top of another. For example, a thin film head structure as used in magnetic recording media (e.g., hard disk drives) can include 20 material layers with patterns for each layer defined by photolithography and either additive processing (e.g., electroplating, liftoff masking, etc.) or subtractive processing (e.g., ion milling, wet etching, reactive ion etching, chemical mechanical processing, etc.).

The additive or subtractive processing steps function in conjunction with a photoresist. When a photoresist is exposed to a radiation source (e.g., light) of a specific wavelength, the chemical properties of the photoresist solution changes, thereby creating a mask, or template. The mask can then be used with, for example, a subtractive process (e.g., uncovered region is etched away) where the exposed material that is not covered by the mask is etched away (e.g., wet etching, reactive ion etching, or the like).

However, a problem exists with regard to the fact that as the dimensions for photolithography defined features continually grow smaller and smaller, the proper alignment of each mask layer with successive mask layers becomes increasingly problematic. In order to ensure the integrity of a multilayer device, the patterns for different lithography steps that belong to a single structure must be aligned to one another. To accomplish alignment, each pattern transferred to a wafer usually includes a set of alignment marks, which are high precision features that are used as the reference when positioning subsequent patterns. The problem is that as device feature sizes decrease, the resulting reduction of critical dimensions creates ever more stringent overlay requirements. These stringent requirements have traditionally been met with improvements in stepper technology and alignment systems, but development of these technologies is unable to keep pace with ever-increasing demands.

Therefore, what is required is a new method for effectively controlling photolithography overlay and mask alignment processes. The present invention provides a novel solution to this requirement.

SUMMARY OF THE INVENTION

Embodiments of the present invention provide a method and system for effectively controlling photolithography overlay and mask alignment processes.

In one embodiment, the present invention is implemented as a method for a magneto-optical photoresist. The method includes applying a magneto-optical photoresist to a surface, and patterning the magneto-optical photoresist by using a magnetic alignment. The magneto-optical photoresist is also patterned by using a photo exposure, wherein the magnetic alignment provides a photo exposure alignment for the photo exposure.

In another embodiment, the magneto-optical photoresist has a sensitivity to both light and a magnetic field gradient. The magnetic field gradient can be used to create the magnetic alignment. The magnetic field gradient can be used to pattern the magneto-optical photoresist and generate a self-aligned photoresist exposure over a plurality of magnetic structures on the surface.

In yet another embodiment, the magneto-optical photoresist comprises a photoresist with a colloidal suspension of magnetically sensitive particles. The photoresist can be a positive photoresist or a negative photoresist. The magnetically sensitive particles can be magnetic particles or paramagnetic particles. In one embodiment, the magnetically sensitive particles are each surfactant coated (e.g., to prevent coagulation).

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Figure 1:
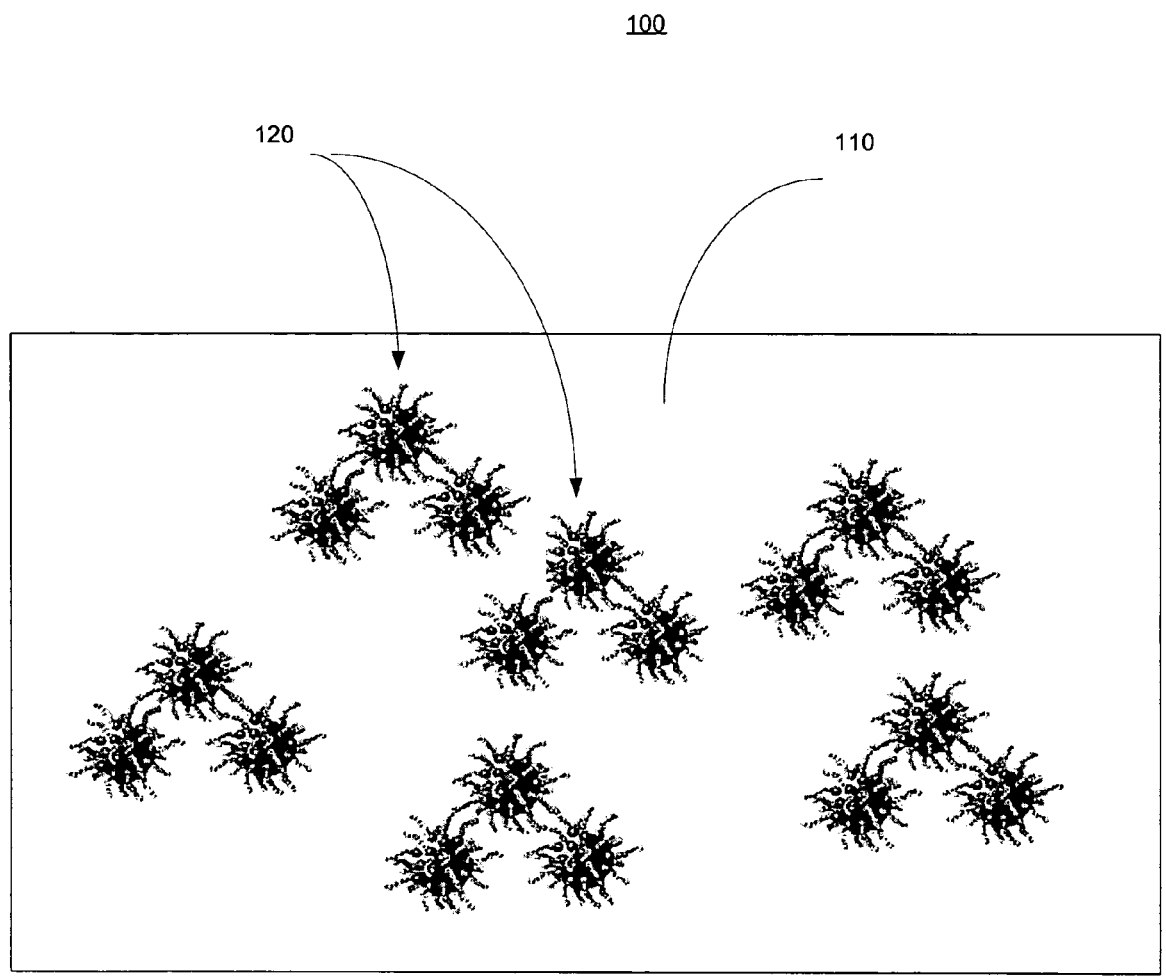
FIG. 1 shows a diagram of a magneto-optical photoresist fluid in accordance with one embodiment of the present invention.

FIG. 1 shows a diagram of a magneto-optical photoresist fluid 100 in accordance with one embodiment of the present invention. As depicted in FIG. 1, the magneto-optical photoresist fluid comprises a photoresist fluid material 110 having a plurality of magnetically sensitive particles, such as the exemplary particles 120, in suspension therein.

In the FIG. 1 embodiment, the magneto-optical photoresist fluid 100, or simply the photoresist 100, comprises a photoresist fluid 110 that is sensitive to photo exposure, by light, etc., as is used in photolithography manufacturing techniques. This fluid 110 holds in suspension a plurality of magnetically sensitive particles 120.

In the FIG. 1 embodiment, the magnetically sensitive particles are magnetic or paramagnetic particles of a ferrofluid. Generally, a ferrofluid is a liquid that becomes polarized in the presence of a magnetic field. Ferrofluids typically comprise nanometer size (e.g., 10 nm in diameter) ferromagnetic particles suspended in a carrier fluid, such as, for example, an organic solvent or water. In the FIG. 1 embodiment, the carrier fluid comprises an optical photoresist fluid (e.g., fluid 110).

In one embodiment, the magnetically sensitive particles 120 are coated with a surfactant to prevent their coagulation/agglomeration within the fluid 110. The surfactant aides in maintaining an even distribution of the magnetically sensitive particles 120 throughout the fluid 110. Additionally, their surfactant makes it easier to maintain the desired concentration of magnetically sensitive particles 120 within a given volume of the fluid 110.

Figure 2:
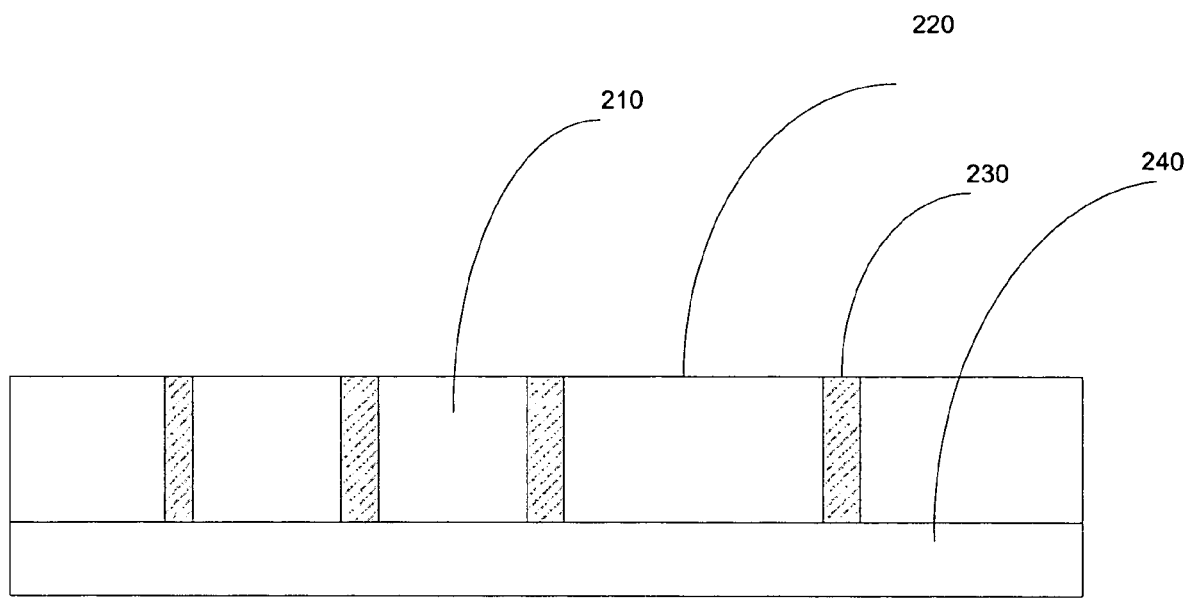
FIG. 2 shows a surface including a plurality of magnetic structures upon which the magneto-optical photoresist fluid is to be applied in accordance with one embodiment of the present invention.

FIG. 2 shows a surface 220 including a plurality of magnetic structures 230 upon which the magneto-optical photoresist fluid 100 is to be applied in accordance with one embodiment of the present invention. As depicted in FIG. 2, the surface 220 is disposed over a layer 240, which is typically a wafer with layers of processed material. The magnetic structures, such as the exemplary magnetic structure 230, are interspersed between nonmagnetic material 210. The magnetic structures are typically built during a prior fabrication step, through, for example, a deposition process followed by chemical mechanical polishing, or the like. In one embodiment, the magnetic structures comprise magnetic $N_3$ or $P_2$ in a nonmagnetic matrix, typically alumina. In the FIG. 2 embodiment, the magnetic structures (e.g., magnetic structure 230) are the features of the surface 222 to which the photoresist 100 will self-align.

Figure 3:
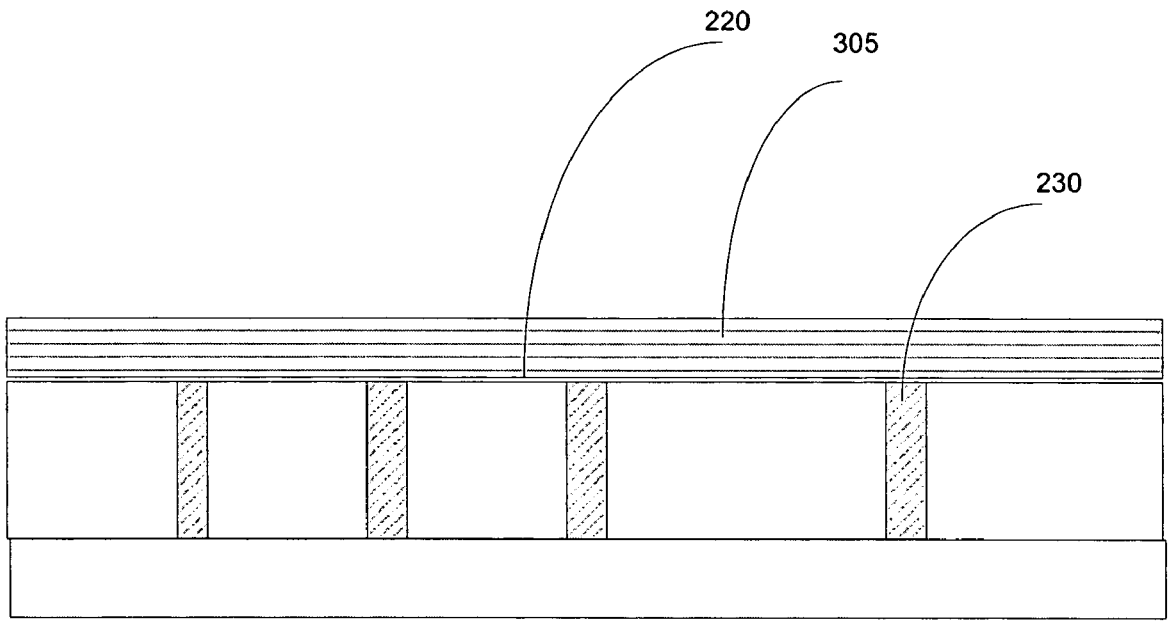
FIG. 3 shows a spin coated photoresist layer covering a wafer surface in accordance with one embodiment of the present invention.

FIG. 3 shows a spin coated photoresist layer 305 covering the surface 220 in accordance with one embodiment of the present invention. As shown in FIG. 3, the photoresist 100 is applied across the surface 220 of the wafer. At this point in the process, the magnetically sensitive particles are evenly distributed within the layer 305. The spin coating process is configured to distribute the layer 305 to a desire sickness across the surface 220.

As the photoresist 100 is applied to create the layer 305, an externally generated magnetic field is applied across the wafer. This externally applied magnetic field causes a concentration of magnetic field gradient in the areas of the magnetic structures 230. The areas of the comparatively large magnetic field gradient in the vicinity of the magnetic structures 230 causes the magnetically sensitive particles to concentrate.

Figure 4:
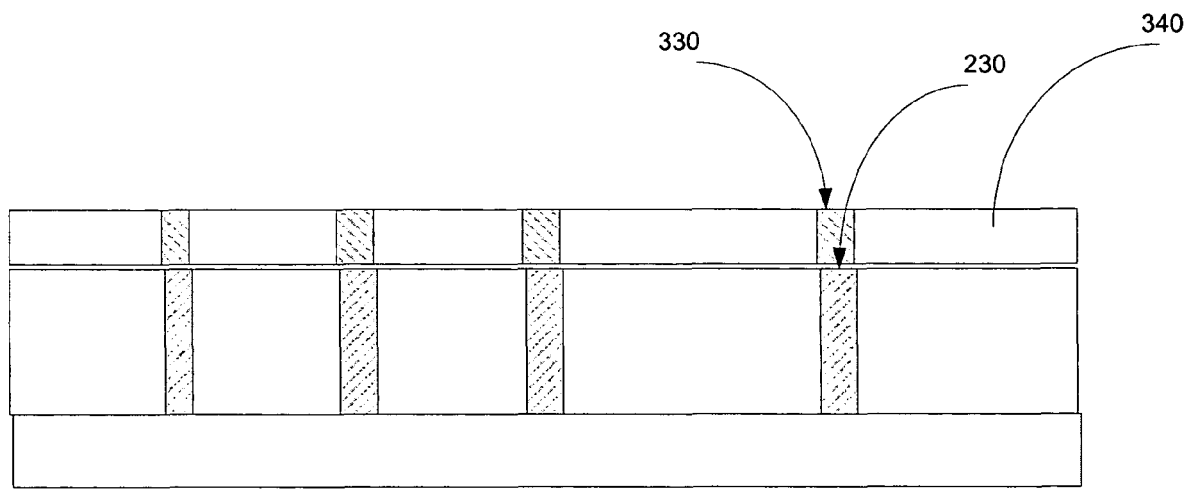
FIG. 4 shows a diagram illustrating concentrated areas of the magnetically sensitive particles aligned over the magnetic structures in accordance with one embodiment of the present invention.

FIG. 4 shows a diagram illustrating concentrated areas of the magnetically sensitive particles aligned over the magnetic structures in accordance with one embodiment of the present invention. As depicted in FIG. 4, the concentrated areas (e.g., area 330) are disposed virtually above the magnetic structures (e.g., magnetic structure 230).

As described above, as the photoresist 100 is applied (e.g., via a spin-on process or the like), an externally generated magnetic field is applied across the wafer, which in turn causes a concentration of magnetic field gradient in the areas of the magnetic structures. This causes the magnetically sensitive particles to concentrate in the areas with the largest field gradient (e.g., the magnetic structures) and essentially create a "self-aligned" feature within the layer 305.

The self-aligned features comprise the regions of concentrated magnetically sensitive particles (e.g., region 330) interspersed between the regions (e.g., region 340) which are comparatively free of the particles. The externally applied magnetic field gradient has caused the magnetic regions 330 to be aligned with the underlying magnetic structures 230. This magnetic alignment, or magnetic patterning, of the photoresist 100 takes place without any exposure to, or application of, light. Additionally, this alignment is accurate to 20 nanometers or less, which is at least one order of magnitude more accurate than prior art optical alignment techniques.

Once the magnetic regions 330 are properly aligned with the underlying magnetic structures 230, the photoresist is "soft baked" to increase its viscosity and reduce its tendency to flow laterally across the wafer surface. This effectively holds in place the magnetic regions 330.

The wafer is subsequently photo exposed to light. The magnetic regions 330 are high in concentrations of the magnetically sensitive particles. Because of this, the magnetic regions 330 do not transmit light. This results in the photoresist 100 being developed in alignment with the magnetic regions 330.

Figure 5:
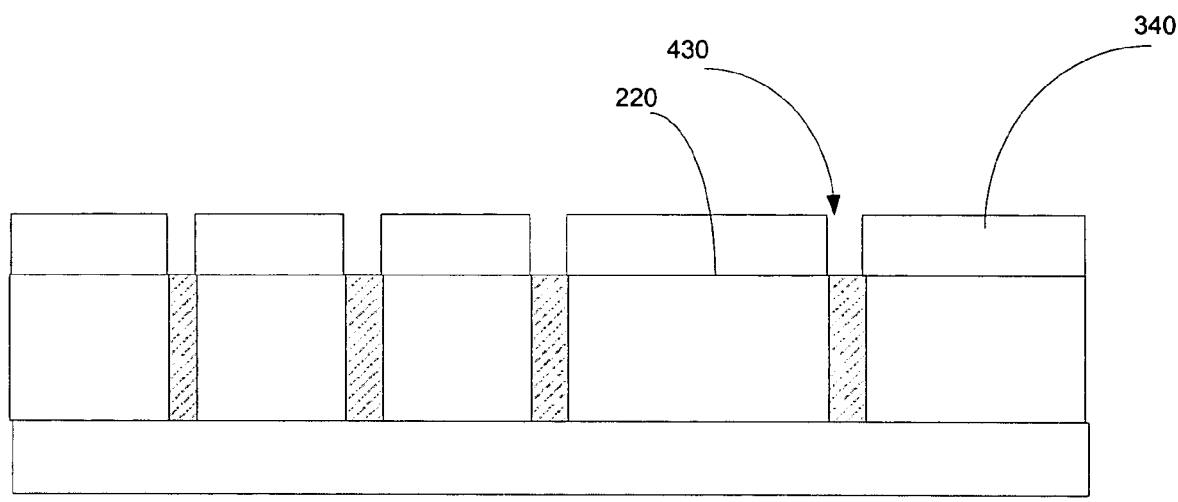
FIG. 5 shows a diagram depicting the wafer after a negative magneto-optical photoresist process in accordance with one embodiment of the present invention.

FIG. 5 shows a diagram depicting the wafer after a negative magneto-optical photoresist process in accordance with one embodiment of the present invention. As depicted in FIG. 5, after the negative process, the areas of the photoresist layer that are sensitive to light have been developed (e.g., such as the exemplary area 340). The magnetic regions 330 do not transmit light and thus are not developed. This allows the magnetic regions 330 to be removed, leaving voids disposed over the magnetic structures (e.g., such as the exemplary void 430). This leaves the surface 220 ready for subsequent processing where the surface areas under the voids are exposed (e.g., electroplating, or the like).

Figure 6:
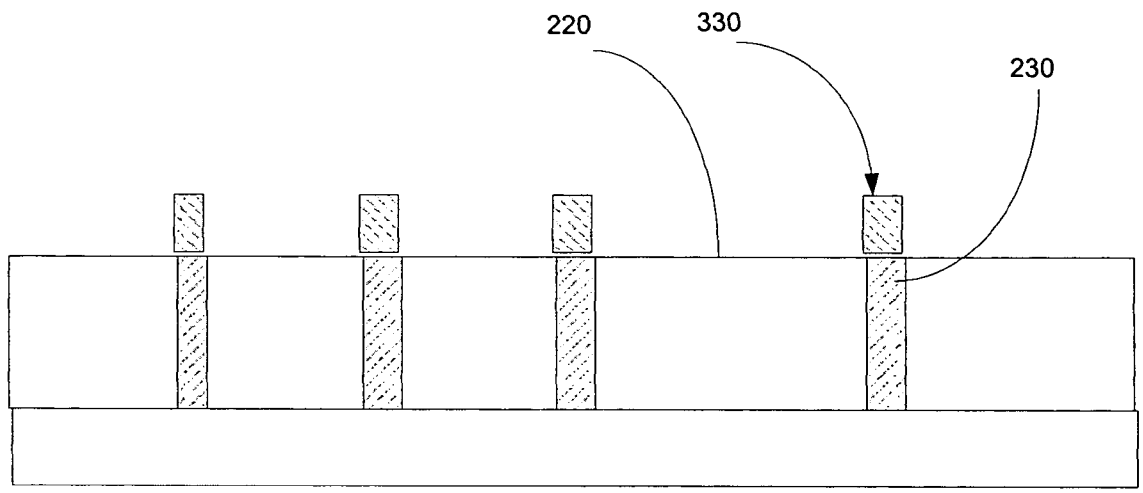
FIG. 6 shows a diagram depicting the wafer after a positive magneto-optical photoresist process in accordance with one embodiment of the present invention.

FIG. 6 shows a diagram depicting the wafer after a positive magneto-optical photoresist process in accordance with one embodiment of the present invention. As depicted in FIG. 6, after the positive process, the areas of the photoresist layer that are sensitive to light have been developed (e.g., such as the exemplary area 340). The magnetic regions 330 do not transmit light and thus are not developed. In a positive process, this allows the non-magnetic regions 340 to be removed, leaving the magnetic regions 340 covering each of the magnetic structures 230. This leaves the surface 220 ready for subsequent processing on the exposed areas (e.g., etching, or the like).

It should be noted that when the wafer is exposed to light as described above, this exposure can be accomplished in conjunction with an optional photomask. The optional photomask enables the definition of other features on the photoresist by using conventional photographic techniques. This is in addition to the self-aligned features described above.

Figure 8:
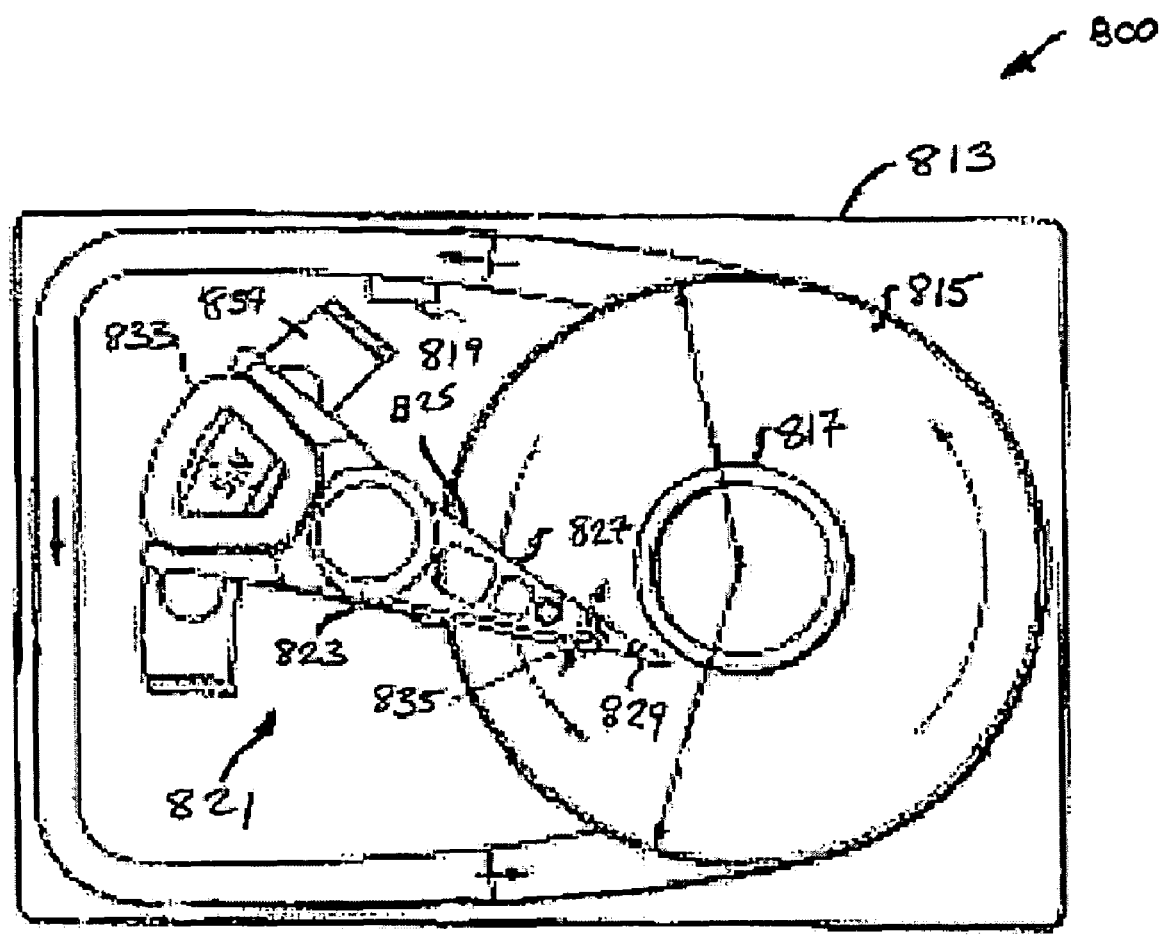
FIG. 8 is a drawing of an exemplary embodiment of a magnetic hard disk drive for a computer system in accordance with one embodiment of the present invention.

Additionally, it should be noted that the magneto-optical photoresist process as described herein can be readily utilized to implement thin-film head manufacturing steps (e.g., for disk drive mechanisms) such as the manufacture of a slider mechanism (e.g., slider 829 of FIG. 8) for a disk drive (e.g., drive 800 of FIG. 8).

Figure 7:
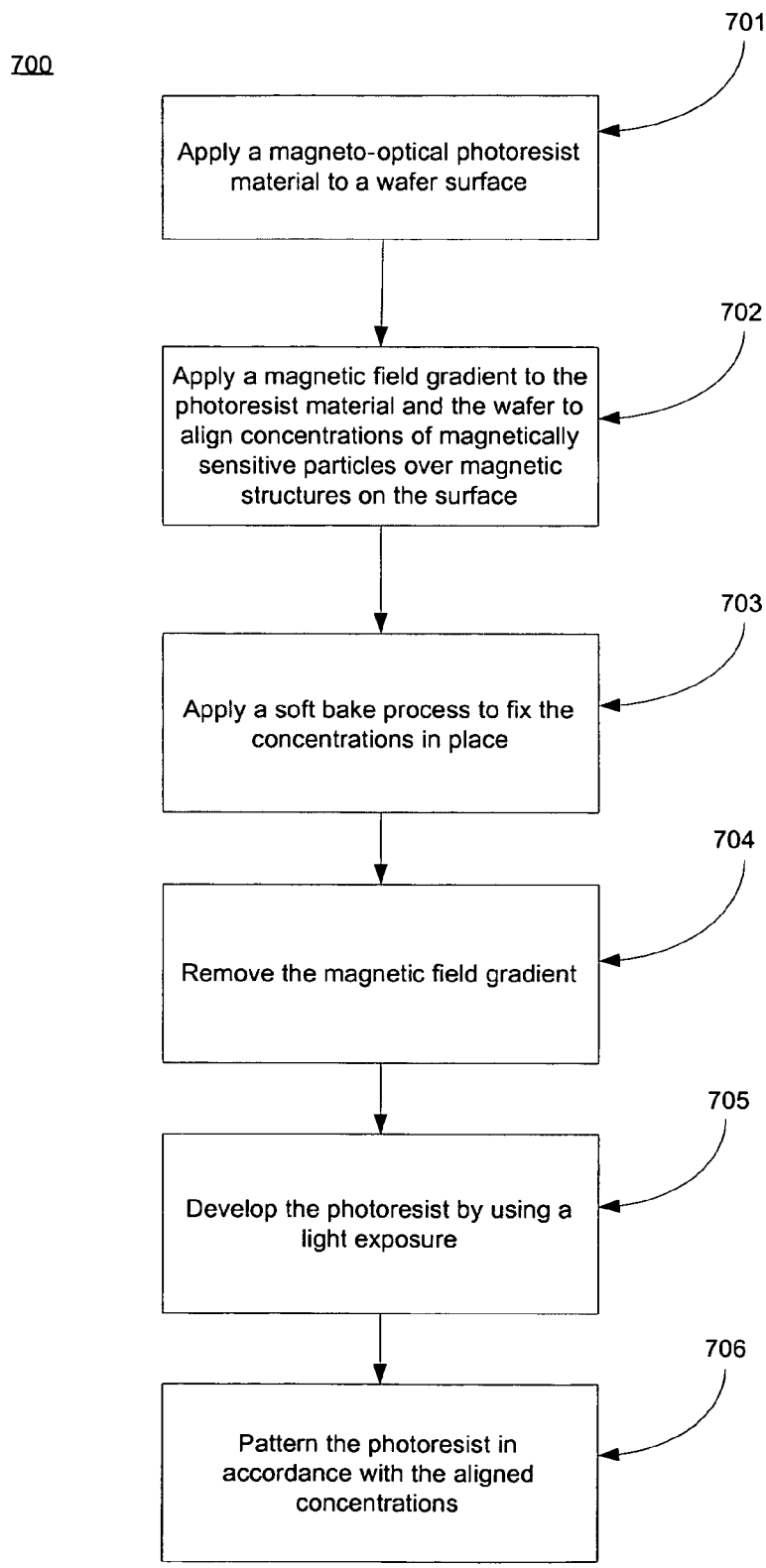
FIG. 7 shows a flowchart of the steps of a magneto-optical photoresist process 700 in accordance with one embodiment of the present invention.

FIG. 7 shows a flowchart of the steps of an exemplary magneto-optical photoresist process 700 in accordance with one embodiment of the present invention. As depicted in FIG. 7, process 700 shows the operating steps of a general magneto-optical photoresist process used to manufacture, for example, a slider mechanism of a disk drive.

Process 700 begins in step 701, where a magneto-optical photoresist material is applied (e.g., using spin-on techniques) to a wafer surface. In step 702, a magnetic field gradient is applied to the photoresist material and to the wafer as the photoresist material is being applied. As described above, this causes concentrations of the magnetically sensitive particles within the photoresist material to align over magnetic structures on the surface of the wafer. In step 703, a soft bake process is applied to the wafer in order to fix the concentrations of magnetically sensitive particles in place within the photoresist layer. In step 704, once the concentrations are fixed in place, the magnetic field gradient is removed. In step 705, the photoresist is developed by using a light exposure. As described above, the concentrations of magnetically sensitive particles do not transmit light and are thus not developed. Then in step 706, the photoresist is patterned, using either a negative process or a positive process as described above, in accordance with the aligned concentrations of magnetically sensitive particles. In this manner, embodiments of the present invention provide a photolithography mask self-alignment process that can ensure the correct alignment of successive mask layers as feature sizes continually grow smaller and smaller.

FIG. 8 is a drawing of an exemplary embodiment of an information storage system comprising a magnetic hard disk file or drive 800 for a computer system, in accordance with embodiments of the present invention. Drive 800 has an outer housing or base 813 containing a disk pack having at least one media or magnetic disk 815. A spindle motor assembly having a central drive hub 817 rotates the disk or disks 815. An actuator 821 comprises a plurality of parallel actuator arms 825 (one shown) in the form of a comb that is movably or pivotally mounted to base 813 about a pivot assembly 823. A controller 819 is also mounted to base 813 for selectively moving the comb of arms 825 relative to disk 815.

In the embodiment shown, each arm 825 has extending from it at least one cantilevered load beam and suspension 827. A magnetic read/write transducer or head is mounted on a slider 829 and secured to a flexure that is flexibly mounted to each suspension 827. The read/write heads magnetically read data from and/or magnetically write data to disk 815. The level of integration called the head gimbal assembly is head and the slider 829, which are mounted on suspension 827. The slider 829 is usually bonded to the end of suspension 827. The head is typically pico size (approximately 1250×1000×300 microns) and formed from ceramic or intermetallic materials. The head also may be of "femto" size (approximately 850× 700×230 microns) and is pre-loaded against the surface of disk 115 (in the range two to ten grams) by suspension 827.

Suspensions 827 have a spring-like quality, which biases or urges the air-bearing surface of the slider 829 against the disk 815 to cause the slider 829 to fly at a precise distance from the disk. A voice coil 833 free to move within a conventional voice coil motor magnet assembly 134 (top pole not shown) is also mounted to arms 825 opposite the head gimbal assemblies. Movement of the actuator 821 (indicated by arrow 835) by controller 819 moves the head gimbal assemblies along radial arcs across tracks on the disk 815 until the heads settle on their respective target tracks. The head gimbal assemblies operate in a conventional manner and always move in unison with one another, unless drive 800 uses multiple independent actuators (not shown) wherein the arms can move independently of one another.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for a magneto-optical photoresist, comprising:
applying a magneto-optical photoresist to a surface;
patterning the magneto-optical photoresist by using a magnetic alignment, wherein said magneto-optical photoresist comprises a photoresist with a colloidal suspension of magnetically sensitive particles that are each surfactant coated, and wherein said magnetically sensitive particles are magnetic particles or paramagnetic particles of a ferrofluid, said surfactant enabling even distribution of said magnetically sensitive particles in said ferrofluid; and
patterning the magneto-optical photoresist by using a photo exposure, wherein the magnetic alignment provides a photo exposure alignment for the photo exposure, and wherein said magneto-optical photoresist has a sensitivity to light and a sensitivity to a magnetic field gradient, said magnetic field gradient being used to create said magnetic alignment that is accurate to 20 nanometers or less, thereby enabling a maintenance of a desired concentration of said magnetically sensitive particles within a given volume of said ferrofluid within said magneto-optical photoresist.

2. The method of claim 1, wherein the patterning of the magneto-optical photoresist generates a self-aligned photoresist exposure over a plurality of magnetic structures on the surface.

3. The method of claim 1, wherein the photoresist is a positive photoresist or a negative photoresist.

4. A photolithography mask alignment process, comprising:
applying a photoresist to a surface, the photoresist comprising a photosensitive fluid having a colloidal suspension of magnetically sensitive particles that are magnetic particles or paramagnetic particles of a ferrofluid, wherein said magnetically sensitive particles are each coated with a surfactant, said surfactant enabling even distribution of said magnetically sensitive particles in said ferrofluid;

applying a magnetic field gradient to the photoresist to generate an exposure aligned over a plurality of magnetic structures on the surface; and patterning the photoresist by using a light exposure in accordance with a magnetic alignment, said magnetic field gradient being used to create said magnetic alignment that is accurate to 20 nanometers or less, thereby enabling a maintenance of a desired concentration of said magnetically sensitive particles within a given volume of said ferrofluid within said magneto-optical photoresist.

5. The process of claim 4, wherein the photoresist is a positive photoresist or a negative photoresist.

6. The process of claim 4, wherein the photolithography mask alignment process is implemented in a thin film magnetic head manufacturing process.

7. The process of claim 4, wherein the photolithography mask alignment process is implemented in an integrated circuit fabrication process.

8. A method for photolithography fabrication processing, comprising:

applying a photoresist to a surface, the photoresist comprising a photosensitive fluid with a colloidal suspension of magnetically sensitive particles that are magnetic particles or paramagnetic particles of a ferrofluid, wherein said magnetically sensitive particles are each coated with a surfactant, said surfactant enabling even distribution of said magnetically sensitive particles in said ferrofluid;

applying a magnetic field gradient to the photoresist to align a substantial concentration of the magnetically sensitive particles over a plurality of magnetic structures on the surface;

applying a bake process to fix the substantial concentration of the magnetically sensitive particles in place;

removing the magnetic field gradient; and patterning the photoresist by using a light exposure in accordance with the magnetic alignment, said magnetic field gradient being used to create said magnetic alignment that is accurate to 20 nanometers or less, thereby enabling a maintenance of a desired concentration of said magnetically sensitive particles within a given volume of said ferrofluid within said magneto-optical photoresist.

9. The method of claim 8, wherein the photoresist is a positive photoresist or a negative photoresist.

* * * * *